United States Patent
Hoegerl et al.

(10) Patent No.: US 11,004,764 B2
(45) Date of Patent: May 11, 2021

(54) SEMICONDUCTOR PACKAGE HAVING SYMMETRICALLY ARRANGED POWER TERMINALS AND METHOD FOR PRODUCING THE SAME

(71) Applicant: Infineon Technologies AG, Neubiberg (DE)

(72) Inventors: Juergen Hoegerl, Regensburg (DE); Tao Hong, Soest (DE); Tino Karczewski, Sinzing (DE); Matthias Lassmann, Lippstadt (DE); Christian Schweikert, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/519,802

(22) Filed: Jul. 23, 2019

(65) Prior Publication Data
US 2020/0035579 A1    Jan. 30, 2020

(30) Foreign Application Priority Data
Jul. 25, 2018    (DE) .......................... 102018212436.1

(51) Int. Cl.
*H01L 21/00*    (2006.01)
*H01L 23/34*    (2006.01)
(Continued)

(52) U.S. Cl.
CPC ............ *H01L 23/367* (2013.01); *H01L 21/56* (2013.01); *H01L 23/3121* (2013.01);
(Continued)

(58) Field of Classification Search
CPC ................ H01L 23/49568; H01L 23/3672
(Continued)

(56) References Cited

U.S. PATENT DOCUMENTS 8,358,000 B2 * 1/2013 Beaupre ................ H01L 23/473
8,654,554 B2 * 2/2014 Seki ........................ H01L 24/32
(Continued)

FOREIGN PATENT DOCUMENTS

DE    102014209690 A1    11/2015
DE    112014004147 T5    7/2016
(Continued)

*Primary Examiner* — Calvin Lee
(74) *Attorney, Agent, or Firm* — Murphy, Bilak & Homiller, PLLC (57) ABSTRACT

A double-sided coolable semiconductor package includes an upper electrically conductive element having an outwardly exposed metal surface, a lower carrier substrate having an upper electrically conductive layer, a lower electrically conductive layer having an outwardly exposed surface, and an electrical insulation layer arranged between the electrically conductive layers, a first electrically conductive spacer arranged between the upper electrically conductive element and the upper electrically conductive layer, a power semiconductor chip arranged between the upper electrically conductive element and the upper electrically conductive layer, a second electrically conductive spacer arranged between the upper electrically conductive element and the chip, and power terminals arranged along a first side of the package. A second power terminal is arranged between first and third power terminals. The first and third power terminals are configured to apply a first supply voltage. The second power terminal is configured to apply a second supply voltage.

19 Claims, 8 Drawing Sheets

(51) Int. Cl.
  *H01L 23/367*  (2006.01)
  *H01L 23/492*  (2006.01)
  *H01L 23/373*  (2006.01)
  *H01L 23/495*  (2006.01)
  *H01L 23/31*   (2006.01)
  *H01L 21/56*   (2006.01)
  *H01L 23/433*  (2006.01)

(52) U.S. Cl.
  CPC ........ *H01L 23/3735* (2013.01); *H01L 23/433* (2013.01); *H01L 23/492* (2013.01); *H01L 23/49524* (2013.01)

(58) Field of Classification Search
  USPC ................. 257/705–707, 717–719, 625; 438/121–124
  See application file for complete search history.

(56) References Cited

U.S. PATENT DOCUMENTS

| | | | |
|---|---|---|---|
| 10,002,821 B1 | 6/2018 | Hoegerl | |
| 10,128,165 B2* | 11/2018 | Hable | H01L 24/48 |
| 10,348,214 B2* | 7/2019 | Nakatsu | H02M 7/003 |
| 2007/0090814 A1 | 4/2007 | Hashimoto et al. | |
| 2017/0287875 A1 | 10/2017 | Gao et al. | |
| 2018/0102302 A1 | 4/2018 | Grassmann et al. | |
| 2018/0145007 A1* | 5/2018 | Hatano | H01L 23/3675 |
| 2020/0286865 A1 | 9/2020 | Chew et al. | |

FOREIGN PATENT DOCUMENTS

| | | |
|---|---|---|
| DE | 102016115221 A1 | 2/2018 |
| DE | 102016119485 A1 | 4/2018 |

* cited by examiner

SEMICONDUCTOR PACKAGE HAVING SYMMETRICALLY ARRANGED POWER TERMINALS AND METHOD FOR PRODUCING THE SAME

TECHNICAL FIELD

The present disclosure relates to a semiconductor package having a double-sided cooling structure and symmetrically arranged power terminals. The present disclosure furthermore relates to a method for producing a semiconductor package having a double-sided cooling structure.

BACKGROUND

The constantly increasing requirements made of the performance of electrical circuits for high currents, e.g. in electrical drives for motor vehicles, require further development and improvement of semiconductor packages which are used in such circuits. Such circuits can have inverters, for example, which convert a battery voltage into an AC voltage for the drive of an electric motor. Such an inverter can be realized by a suitable circuit in a semiconductor package, wherein, with regard to the performance of the inverter, it is crucial to achieve sufficient cooling, the lowest possible impedance, the lowest possible leakage inductances, etc. in the semiconductor package. The performance of such inverters can be increased further by means of improved semiconductor packages and/or by means of improved methods for producing such semiconductor packages.

The problem addressed by the invention is solved by the features of the independent patent claims. Advantageous embodiments and developments of the invention are specified in the dependent claims.

SUMMARY

Individual examples relate to a semiconductor package having a double-sided cooling structure, the semiconductor package comprising an upper electrically conductive element having an outwardly exposed metal surface, a lower carrier substrate having an upper electrically conductive layer, a lower electrically conductive layer having an outwardly exposed surface, and an electrical insulation layer arranged between the upper and lower electrically conductive layers, a first electrically conductive spacer arranged between the upper electrically conductive element and the upper electrically conductive layer, at least one power semiconductor chip arranged between the upper electrically conductive element and the upper electrically conductive layer, a second electrically conductive spacer arranged between the upper electrically conductive element and the power semiconductor chip, and a first, second and third power terminal arranged along a first side of the semiconductor package, wherein the second power terminal is arranged between the first and third power terminals, and wherein the first and third power terminals are configured for applying a first supply voltage and wherein the second power terminal is configured for applying a second supply voltage.

Individual examples relate to a method for producing a semiconductor package having a double-sided cooling structure, the method comprising providing a lower carrier substrate having an upper electrically conductive layer, a lower electrically conductive layer and an electrical insulation layer arranged between the upper and lower electrically conductive layers, applying a first electrically conductive spacer to the upper electrically conductive layer of the lower carrier substrate, applying at least one power semiconductor chip to the upper electrically conductive layer of the lower carrier substrate, applying a second electrically conductive spacer to the power semiconductor chip, applying an upper electrically conductive element on the spacers opposite the lower carrier substrate, and arranging a first, second and third power terminal on the upper electrically conductive layer of the lower carrier substrate along a first side of the semiconductor package, wherein the second power terminal is arranged between the first and third power terminals, and wherein the first and third power terminals are configured for applying a first supply voltage and wherein the second power terminal is configured for applying a second supply voltage.

BRIEF DESCRIPTION OF THE DRAWINGS

The accompanying drawings illustrate examples and together with the description serve to explain the principles of the disclosure. The elements in the drawings are not necessarily true to scale with respect to one another. Identical reference signs may designate mutually corresponding, similar or identical parts.

DETAILED DESCRIPTION

In the present description, the expressions "coupled", "electrically coupled" and/or "electrically connected" are not intended to mean that the elements must be directly coupled; intervening elements can be provided between the "coupled" or "electrically coupled" elements, e.g. solder layers.

Figure 1A:
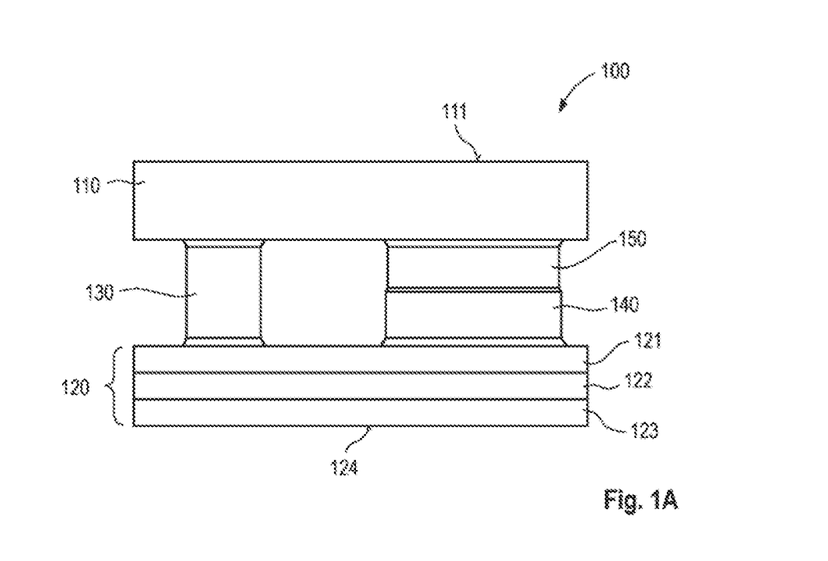
FIG. 1A illustrates a side view of a semiconductor package having a double-sided cooling structure.

FIG. 1A shows a semiconductor package 100 having a double-sided cooling structure in accordance with the disclosure. In this case, "double-sided cooling structure" means that the semiconductor package 100 has an upper electrically conductive element 110 and a lower carrier substrate 120, which can each act as a cooling structure of the semiconductor package 100. The semiconductor package 100 furthermore has a first electrically conductive spacer 130, at least one power semiconductor chip 140 and a second electrically conductive spacer 150. The second electrically conductive spacer 150 is arranged between the upper electrically conductive element 110 and the power semiconductor chip 140.

The lower carrier substrate 120 has an upper electrically conductive layer 121, a lower electrically conductive layer 123 and an electrical insulation layer 122 arranged between the upper 121 and lower 123 conductive layers. The lower carrier substrate 120 can be e.g. a substrate of the DCB (direct copper bond), DAB (direct aluminum bond), or AMB (active metal brazing) type.

In accordance with one example, the semiconductor package 100 can furthermore have an encapsulation body (not shown), which encapsulates the spacers 130, 150, the at least one power semiconductor chip 140, the upper electrically conductive element 110 and the lower carrier substrate 120. In particular, an interspace between the upper electrically conductive element 110 and the lower carrier substrate 120 can be wholly or partly filled by the encapsulation body.

In accordance with one example, the encapsulation body can comprise or consist of a potting compound or molding compound. The encapsulation body can be produced e.g. by means of compression molding. In order to produce the encapsulation body, e.g. the as yet unencapsulated semiconductor package 100 can be placed into a molding tool, a dielectric compound can be injected, and the dielectric compound can be cured to form the encapsulation body.

However, a metal surface 111 of the upper electrically conductive element 110 and a surface 124 of the lower electrically conductive layer 123 are at all events configured such that they are wholly or at least partly outwardly exposed (i.e. the surfaces 111, 124 constitute outer surfaces of the semiconductor package 100).

The electrically conductive spacers 130, 150 can consist of a metal or a metal alloy and can comprise or consist of e.g. Al or Cu. The first electrically conductive spacer 130 is physically and electrically connected to the upper electrically conductive element 110 and the lower carrier substrate 120, e.g. by means of solder connections or by means of electrically conductive adhesive.

In accordance with one example, the at least one power semiconductor chip 140 comprises or consists of SiC. In accordance with one example, the at least one power semiconductor chip 140 is a chip of the IGBT (insulated-gate bipolar transistor) type. In accordance with one example, a half-bridge circuit is realized in the semiconductor package 100. The half-bridge circuit can have a power terminal for a positive supply voltage ($V_{DD}$), a power terminal for a negative supply voltage ($V_{SS}$) and a power terminal configured as a phase.

The second electrically conductive spacer 150 can be electrically connected to an electrode (not shown) of the power semiconductor chip 140 and to the upper electrically conductive element 110, e.g. by means of solder connections or by means of electrically conductive adhesive. The electrode can be a power electrode or a control electrode of the power semiconductor chip 140. The second electrically conductive spacer 150 can wholly or partly cover the power semiconductor chip 140.

In accordance with one example, the semiconductor package can have external terminals in the form of terminal fingers. At least one portion of said external terminals can be designed to electrically connect electrodes of the at least one power semiconductor chip 140 to the outside world. The external terminals can be electrically connected to the upper electrically conductive element 110 and/or to the upper electrically conductive layer 121. The terminal fingers can be parts of a lead frame. Individual terminals from among the external terminals can be power terminals, which can be electrically connected e.g. to respective power electrodes of the at least one power semiconductor chip 140. One or a plurality of the external terminals can be control terminals, which are electrically connected to a control electrode (e.g. a gate electrode) of the at last one power semiconductor chip 140. Individual terminals from among the external terminals can be measurement terminals, which are designed e.g. to measure $V_{DD}$, $V_{SS}$, the voltage of the phase, a current flow or a temperature in the semiconductor package 100.

The semiconductor package 100 comprises three power terminals arranged alongside one another along a first side of the semiconductor package 100. The outer two of said power terminals are designed for applying a first supply voltage and the central terminal arranged between the outer two power terminals is designed for applying a second supply voltage. In accordance with one example, the first supply voltage is $V_{DD}$ and the second supply voltage is $V_{SS}$. In accordance with another example, the first supply voltage is $V_{SS}$ and the second supply voltage is $V_{DD}$.

Furthermore, the semiconductor package 100 can also be extended by further power terminals at the first side, e.g. by a further $V_{DD}$ or $V_{SS}$ terminal or by $V_{DD}/V_{SS}$ terminal pairs, with the result that symmetry is maintained.

In accordance with one example, the semiconductor package 100 comprises a further power terminal, which is arranged at a second side of the semiconductor package, said second side being situated opposite the first side, and is configured as a phase terminal. The control terminals and/or the measurement terminals of the semiconductor package 100 can likewise be arranged along the second side, e.g. to the left and right of the phase terminal.

The above-described symmetrical arrangement of power terminals for the first and second supply voltages, respectively, can contribute to the semiconductor package 100 having reduced parasitic inductances. In particular, it can be stated that each pair of $V_{DD}$ and $V_{SS}$ forms a "loop", wherein within the respective loop the parasitic inductances of the equal and opposite supply voltages mutually cancel one another out or at least reduce one another. The arrangement of the phase terminal on the opposite side of the semiconductor package 100 relative to the other power terminals can likewise contribute to reducing the inductance in the semiconductor package 100. As a result of these measures, within the semiconductor package 100 it is possible to achieve a considerable reduction of the parasitic inductances, e.g. by an absolute value of approximately 5 nH. Such a reduction of the parasitic inductances can mean a significant improvement in the performance of the electric circuit realized in the semiconductor package 100. Particularly in the case where the at least one power semiconductor chip 140 comprises or consists of SiC, which allows fast switching, the tolerance level for parasitic inductances is very low. The latter can lead in particular to undesired overshooting during switching and to increased switching losses.

Figure 1B:
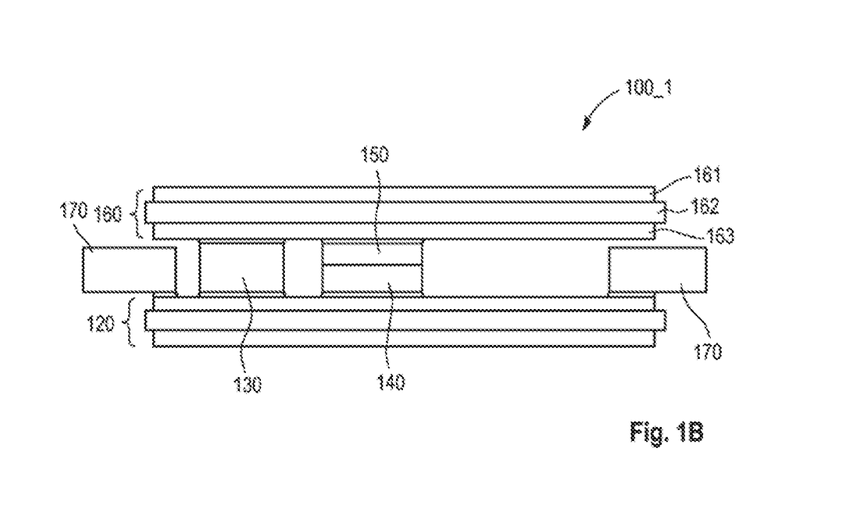
FIG. 1B illustrates a side view of a further semiconductor package having a double-sided cooling structure.

FIG. 1B shows a semiconductor package 100_1, which can correspond to the semiconductor package 100 from FIG. 1A apart from the differences described below. In the case of the semiconductor package 100_1, the upper electrically conductive element 110 has an upper carrier substrate 160 having an upper electrically conductive layer 161, a lower electrically conductive layer 163 and an electrical insulation layer 162 arranged between the upper 161 and lower 163 electrically conductive layers. In this case, the upper electrically conductive layer 161 corresponds to the outwardly exposed metal surface 111.

The semiconductor package 100_1 can furthermore have external terminals 170, which, as shown in FIG. 1B, are arranged between the upper carrier substrate 160 and the lower carrier substrate 120. In accordance with one example, each individual one of the external terminals 170 can be electrically connected to the lower electrically conductive layer 163 of the upper carrier substrate 160 or to the upper electrically conductive layer 121 of the lower carrier substrate 120.

The lower electrically conductive layer 163 of the upper carrier substrate 160 and the upper electrically conductive layer 121 of the lower carrier substrate 120 are structured and can have e.g. chip islands, conduction tracks and/or application locations for the electrically conductive spacers 130, 150.

Figure 2:
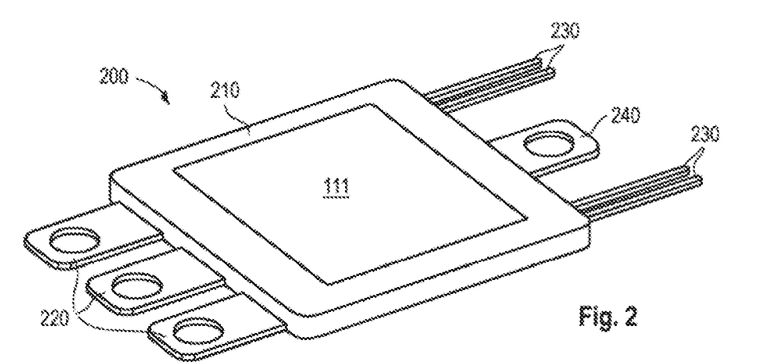
FIG. 2 illustrates a perspective view of a semiconductor package having a double-sided cooling structure, which furthermore comprises an encapsulation body.

FIG. 2 shows a perspective view of a semiconductor package 200, which can be identical to the semiconductor packages 100 and 100_1. The semiconductor package 200 has an encapsulation body 210, which encapsulates the spacers 130, 150, the upper electrically conductive element 110, the lower carrier substrate 120 and the at least one power semiconductor chip 140. The surfaces 111 and the surface 124 (not visible in FIG. 2) are exposed at the encapsulation body 210 at opposite sides of the semiconductor package 200.

The encapsulation body 210 consists of a suitable electrically insulating material or comprises such a material, e.g. a plastic, a polymer or a resin. The encapsulation body 210 can be e.g. a molded body.

The surface 111 and/or the surface 124 can have an electrically insulating coating and can be configured in each case for the application of a heat sink.

The semiconductor package 200 has external terminals 220, 230 arranged at side surfaces of the semiconductor package 200 which connect the opposite sides to the metal surface 111 and the surface 124. The external terminals 220 can be designed as power terminals and the external terminals 230 can be designed as control terminals or measurement terminals. In accordance with one example all power terminals 220 apart from a power terminal 240 configured as a phase are arranged at a first side of the semiconductor package 200, and the power terminal 240 configured as a phase and the control and/or measurement terminals 230 are arranged at a second side situated opposite the first side. A third and a fourth side of the semiconductor package 200 can be free of any terminals. The external terminals 220, 230 and 240 can be parts of a common lead frame.

Figure 3A:
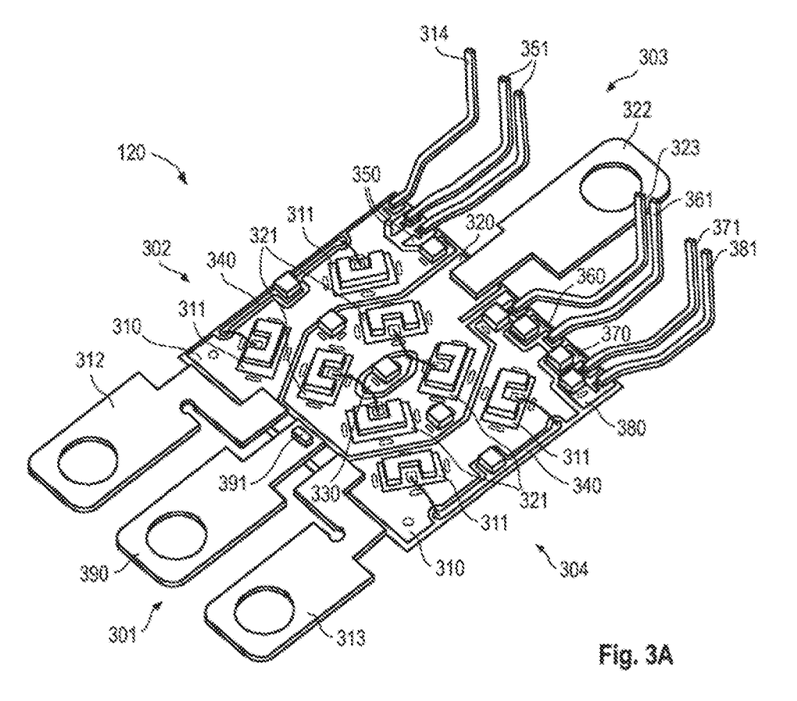
FIG. 3A illustrates a perspective view of a lower carrier substrate of a further semiconductor package.

FIG. 3A shows a perspective view of a lower carrier substrate 120 of a semiconductor package 300. The semiconductor package 300 can be identical to the semiconductor packages 100, 100_1 and 200.

The upper electrically conductive layer 121 of the lower carrier substrate 120 of the semiconductor package 300 is structured and can have first carrier regions 310 and a second carrier region 320. The first carrier regions 310 can partly or completely surround the second carrier region 320 at least two sides 302 and 304 or else at three sides 301, 302 and 304. The first carrier regions 310 can be electrically connected to one another, e.g. via the upper carrier substrate 160. The first carrier regions 310 can also be a single, continuous region 310. Apart from the first carrier regions 310 and the second carrier region 320, the upper electrically conductive layer 121 can have further structured regions, e.g. regions 330, 340, 350, 360, 370 and 380.

First power semiconductor chips 311 can be arranged on the first carrier regions 310. A power electrode, e.g. a drain electrode, arranged in each case on the underside of the first power semiconductor chips 311 can be electrically connected to the first carrier regions 310, e.g. via a solder layer. The first carrier regions 310 are designed for applying the first supply voltage, e.g. $V_{DD}$, and the first power semiconductor chips 311 can be high-side power semiconductor chips of a half-bridge circuit realized in the semiconductor package 300. The first carrier regions 310 can be electrically connected to a first power terminal 312 and a third power terminal 313.

The first carrier regions 310 can furthermore be electrically connected to a measurement terminal 314 designed for a measurement of the voltage present at the first carrier regions 310, e.g. $V_{DD}$.

Second power semiconductor chips 321 can be arranged on the second carrier region 320. A power electrode, e.g. a drain electrode, arranged in each case on the underside of the second power semiconductor chips 321 can be electrically connected to the second carrier region 320, e.g. via a solder layer. The second carrier region 320 can be designed as a phase of the half-bridge circuit and the second power semiconductor chips 321 can be low-side power semiconductor chips of the half-bridge circuit. The second carrier region 320 can be electrically connected to a fourth power terminal 322.

The second carrier region 320 can furthermore be electrically connected to a measurement terminal 323 designed for a measurement of the voltage present at the second carrier region 320, e.g. of the phase.

The region 330 can be a central region and it can be completely surrounded by the second carrier region 320. The region 330 can be electrically connected to control electrodes, e.g. gate electrodes, of the second power semiconductor chips 321, e.g. by means of bond wires. The region 330 can furthermore be electrically connected to the region 370 via the upper carrier substrate 160. A second control terminal 371 for applying a control signal to the second power semiconductor chips 321 can be arranged at the region 370.

The regions 340 can be arranged along the second side 302 and along the fourth side 304, e.g. outside the first carrier regions 310. The regions 340 can be electrically connected to control electrodes, e.g. gate electrodes, of the first power semiconductor chips 311, e.g. by means of bond wires. The regions 340 can furthermore be electrically connected to the region 360 via the upper carrier substrate 160. A first control terminal 361 for applying a control signal to the first power semiconductor chips 311 can be arranged at the region 360.

A resistor, e.g. an NTC (negative thermal coefficient) thermistor, can be applied (not shown in FIG. 3A) on the regions 350. The regions 350 can be electrically connected to measurement terminals 351. The resistor and the measurement terminals 351 can be designed to measure the temperature in the semiconductor package 300 since a voltage drop across the NTC is dependent on the temperature.

Figure 3B:
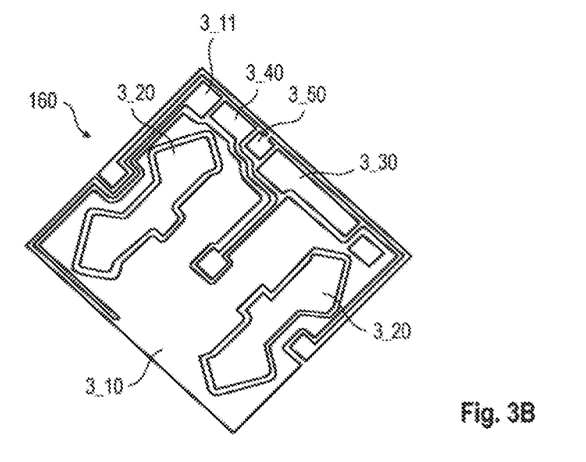
FIG. 3B illustrates the upper cooling structure of the semiconductor package in perspective view.
Figure 3C:
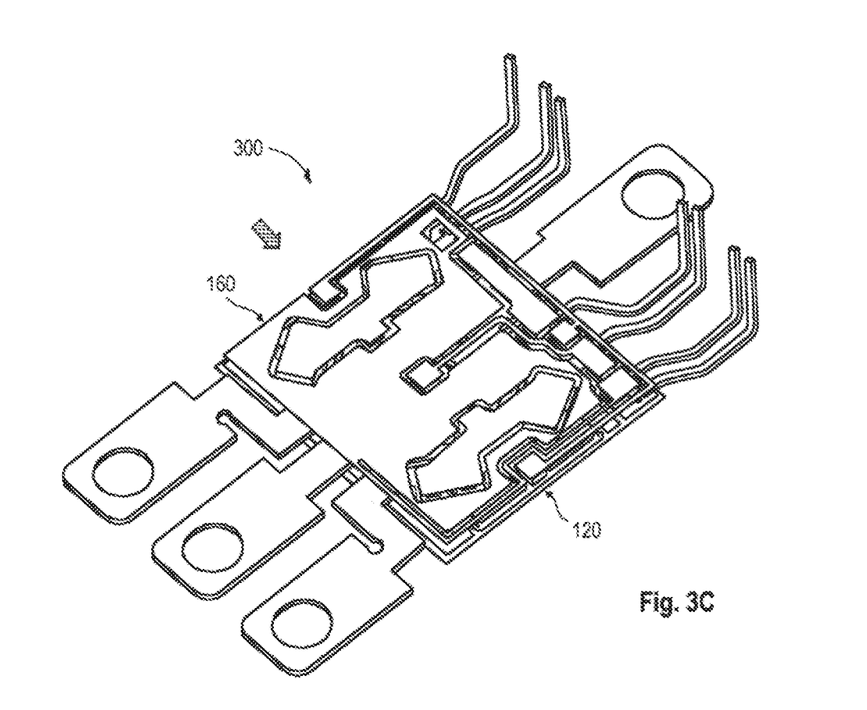
FIG. 3C illustrates the assembled semiconductor package in perspective view.
Figure 3D:
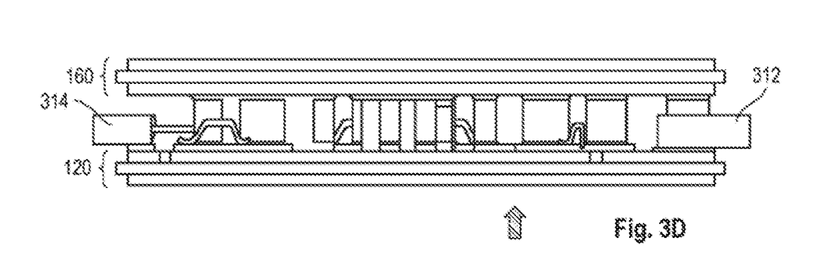
FIG. 3D illustrates a side view of the semiconductor package.

FIG. 3B shows a perspective view of an upper carrier substrate 160 of the semiconductor package 300, wherein FIG. 3B shows a perspective view of the underside of the upper carrier substrate 160 (cf. the arrow in FIG. 3D for the viewing direction).

The lower electrically conductive layer 163 of the upper carrier substrate 160 is structured and has a first region 3_10. The first region 3_10 can at least partly overlap the first carrier regions 310 and/or the second carrier region 320 if the upper carrier substrate 160 is arranged above the lower carrier substrate 120 in the semiconductor package 300. The first region 3_10 is configured for applying the second supply voltage, e.g. $V_{SS}$. The first region 3_10 can be configured to be electrically connected to a second (central) power terminal 390 on the lower carrier substrate 120, e.g. by means of an electrically conductive spacer 391 (the second supply voltage is thus present at the second power terminal 390). The first region 3_10 can be electrically connected to the second power semiconductor chips 321, e.g. by means of the electrically conductive spacers 350 arranged on the second power semiconductor chips 321. In particular, the first region 3_10 can be electrically connected to a power electrode, e.g. a source electrode of the second power semiconductor chips.

The first region 3_10 can have a connection point 3_11, at which the first region 3_10 is electrically connected to the region 380 on the lower carrier substrate 120. A measurement terminal 381 can be arranged at the region 380 and be electrically connected thereto. The measurement terminal 381 can serve to measure the voltage present at the first region 3_10.

The lower electrically conductive layer 163 of the upper carrier substrate 160 has second regions 3_20, which can be electrically connected to the first power semiconductor chips 311, e.g. by means of electrically conductive spacers 150 arranged on the first power semiconductor chips 311. In particular, the second regions 3_20 can be electrically connected to a power electrode, e.g. a source electrode of the second power semiconductor chips. The second regions 3_20 are configured as a phase of the half-bridge circuit of the semiconductor package 300.

The lower electrically conductive layer 163 can have a further region 3_30 configured to be electrically connected to the first carrier regions 310, e.g. by means of electrically conductive spacers 130. The region 3_30 can be configured to electrically connect a first carrier region 310 on the second side 302 and a first carrier region 310 on the fourth side 304 to one another.

The lower electrically conductive layer 163 can have a further region 3_40, which electrically connects the regions 330 and 370 on the lower carrier substrate 120 to one another.

The lower electrically conductive layer 163 can have a further region 3_50, which electrically connects the regions 340 and 360 on the lower carrier substrate 120 to one another.

FIG. 3C shows the semiconductor package 300 after the arrangement of the upper carrier substrate 160 from FIG. 3B above the lower carrier substrate 120 from FIG. 3A. For the sake of clarity, only the lower conductive layer 163 of the upper carrier substrate 160 is shown in FIG. 3C; the upper electrically conductive layer 161 and the insulation layer 162 have been omitted.

In accordance with one example, the semiconductor package 300 comprises an encapsulation body (cf. FIG. 2), which is not shown in FIG. 3C for reasons of clarity.

FIG. 3D shows a side view of the semiconductor package 300 along the direction of the arrow in FIG. 3C.

Figure 4A:
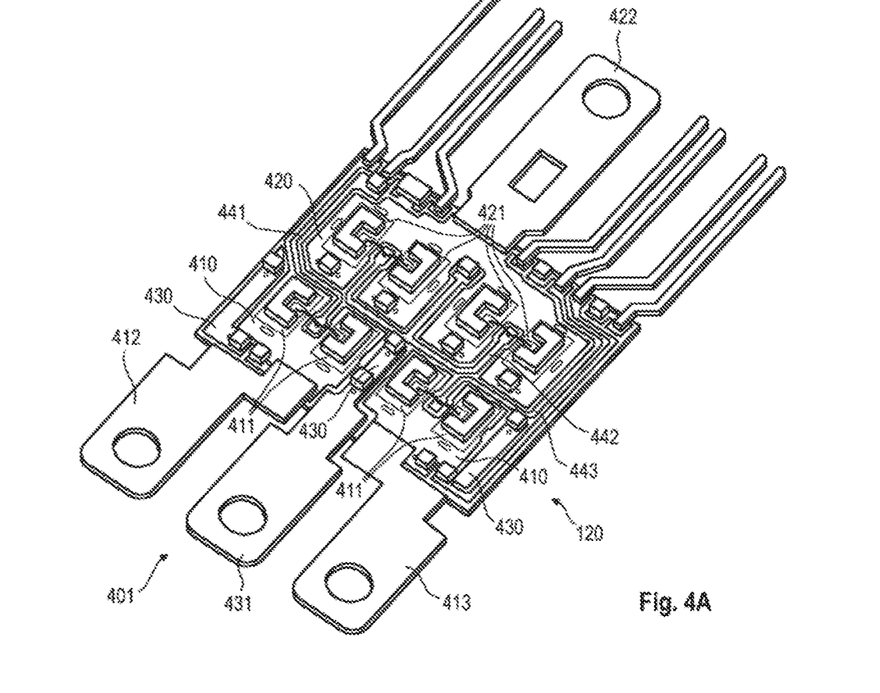
FIG. 4A illustrates a lower carrier substrate of a further semiconductor package.

FIG. 4A shows a perspective view of a lower carrier substrate 120 of a semiconductor package 400. The semiconductor package 400 can be identical to the semiconductor packages 100, 100_1 and 200.

The semiconductor package 400 is similar to the semiconductor package 300 and differs therefrom principally in the arrangement of the first, second and third regions 410, 420 and 430. First power semiconductor chips 411 are arranged on the first regions 410 and are connected to a first 412 and third 413 power terminal. Second power semiconductor chips 421 are arranged on the second region 420 and are connected to a fourth power terminal 422. The first regions 410 thus correspond to the first carrier regions 310 in the semiconductor package 300 and the second region 420 corresponds to the second carrier region 320.

The third regions 430 are electrically connected to a second power terminal 431, which is arranged between the first 412 and the third 413 power terminals.

A first supply voltage, e.g. $V_{DD}$, can be present at the first regions 410 and a negative supply voltage, e.g. $V_{SS}$, can be present at the third regions 430. The second region 420 can be configured as a phase.

The first regions 410 and the third regions 430 can be arranged alternately along a first side 401 of the semiconductor package 400, e.g. in the arrangement as shown in FIG. 4A. As a result, the third regions 430 can act as a kind of shield for the first regions 410, and vice versa. Such an alternating arrangement of regions to which the first supply voltage can be applied and regions to which the second supply voltage can be applied can contribute to reducing leakage inductances in the semiconductor package 400.

Lines 441, 442, 443 in the upper conductive layer 121 can at least partly be surrounded and thereby shielded, in particular also electromagnetically shielded, by the first, second and/or third regions 410, 420 and 430. The lines 441, 442 and 443 can be e.g. control lines connecting control electrodes, e.g. gate electrodes, of the power semiconductor chips 411 and respectively 421 to control terminals of the semiconductor package 400.

Figure 4B:
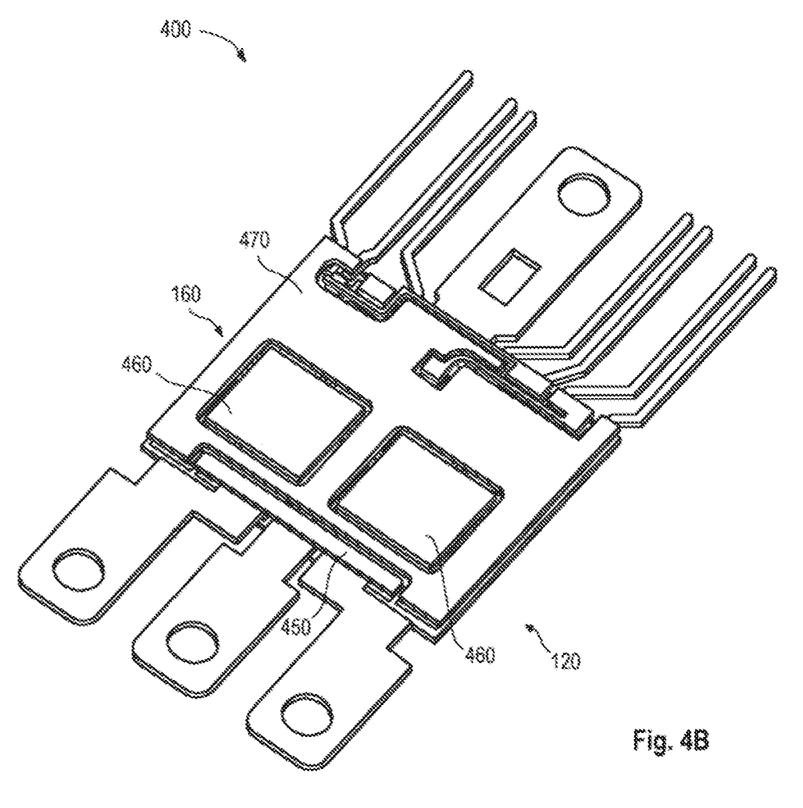
FIG. 4B illustrates the assembled semiconductor package in perspective view.

FIG. 4B shows the semiconductor package 400 after the arrangement of the upper carrier substrate 160 above the lower carrier substrate 120 from FIG. 4A. For the sake of clarity, only the lower conductive layer 163 of the upper carrier substrate 160 is shown in FIG. 4B; the upper electrically conductive layer 161 and the insulation layer 162 have been omitted.

The upper carrier substrate 160 of the semiconductor package 400 can have a fourth region 450, fifth regions 460 and a sixth region 470. The fourth region 450 can be designed to electrically connect the first regions 410 on the lower carrier substrate 120 to one another. The fifth regions 460 can be electrically connected in each case to the first power semiconductor chips 411 and to the second region 420. The fifth regions can be designed as a phase. The sixth region 4170 can be electrically connected to the second power semiconductor chips 421 and to the third regions 430. The sixth region 470 can be designed for applying the second supply voltage.

Figure 5:
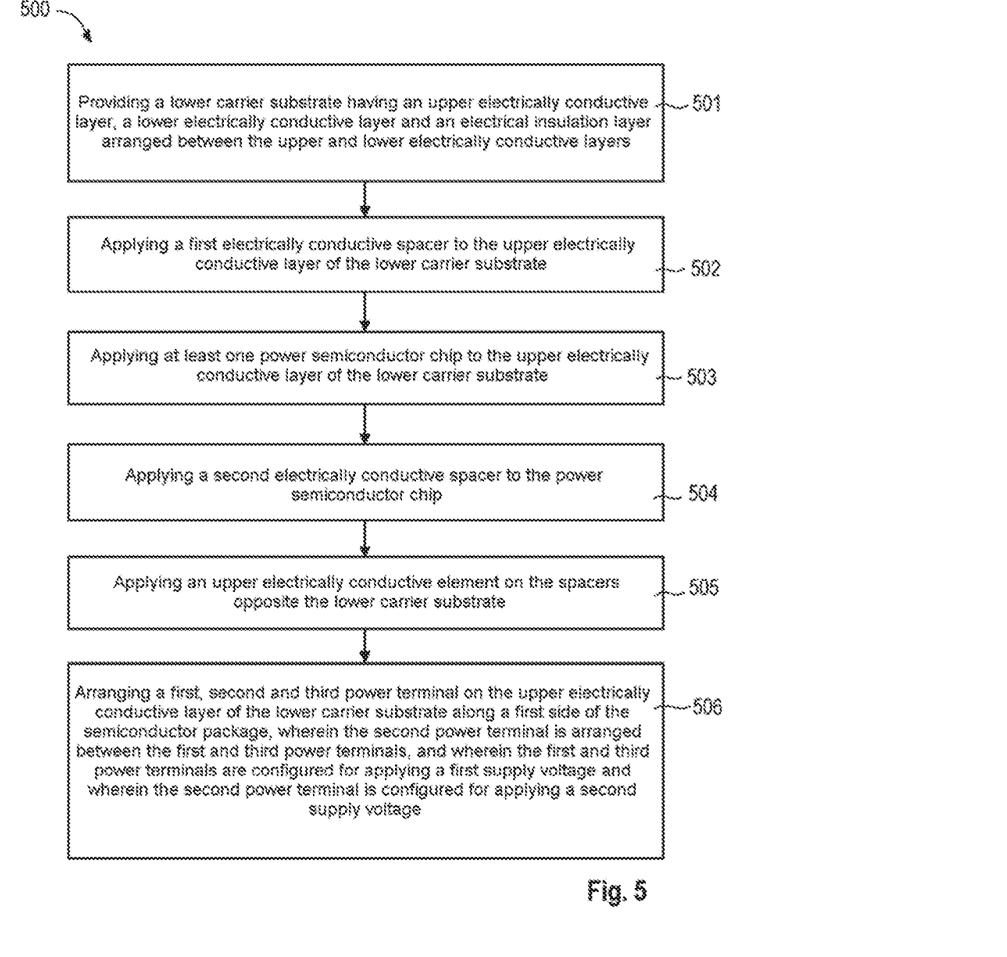
FIG. 5 illustrates a flow diagram of a method for producing a semiconductor package.

FIG. 5 shows a flow diagram of a method 500 for producing a semiconductor package having a double-sided cooling structure. By way of example, the semiconductor packages 100, 100_1, 200, 300 and 400 can be produced in accordance with the method 500.

The method 500 comprises, at 501, providing a lower carrier substrate having an upper electrically conductive layer, a lower electrically conductive layer and an electrical insulation layer arranged between the upper and lower electrically conductive layers. The method 500 comprises, at 502, applying a first electrically conductive spacer to the upper electrically conductive layer of the lower carrier substrate. The method 500 comprises, at 503, applying at least one power semiconductor chip to the upper electrically conductive layer of the lower carrier substrate. The method 500 comprises, at 504, applying a second electrically conductive spacer to the power semiconductor chip. The method 500 comprises, at 505, applying an upper electrically conductive element on the spacers opposite the lower carrier substrate. The method 500 comprises, at 506, arranging a first, second and third power terminal on the upper electrically conductive layer of the lower carrier substrate along a first side of the semiconductor package, wherein the second power terminal is arranged between the first and third power terminals, and wherein the first and third power terminals are configured for applying a first supply voltage and wherein the second power terminal is configured for applying a second supply voltage.

The method 500 can furthermore comprise the fact that arranging the first, second and third power terminals comprises extracting the first, second and third power terminals from a lead frame. The method 500 can furthermore comprise electrically connecting the second power terminal to the upper electrically conductive element. The method 500 can furthermore comprise encapsulating the spacers, the at least one power semiconductor chip, the upper electrically conductive element and the lower carrier substrate into an encapsulation body.

A further example of a semiconductor package 600 is shown below with reference to FIGS. 6A through 6C. The semiconductor package 600 can be similar to the semiconductor packages 100, 100_1, 200, 300 and 400 and have, in comparison therewith, only the differences shown below. The semiconductor package 600 can be produced in accordance with a production method such as the method 500.

Figure 6A:
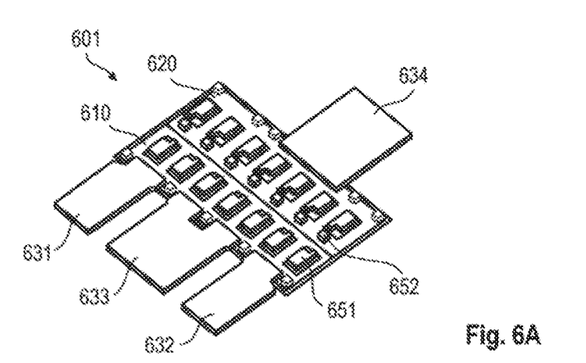
FIGS. 6A to 6C illustrates further examples of a semiconductor package.

FIG. 6A shows a lower carrier substrate 601 of the semiconductor package 600. The lower carrier substrate 601 has a first carrier region 610 with first power semiconductor chips and a second carrier region 620 with second power semiconductor chips, said second carrier region being arranged alongside the first carrier region 610. The first carrier region 610 can be designed e.g. for applying $V_{DD}$ and the second carrier region 620 can be designed e.g. as a phase.

In accordance with one example, a first power terminal 631, a second power terminal 632 and a third power terminal 633 can be arranged at a first side of the lower carrier substrate 601. The first and second power terminals 631, 632 can be electrically connected to the first carrier region 610 and can be designed e.g. as $V_{DD}$ terminals. The third power terminal 633 can be arranged between the first and second power terminals 631, 632 and can be designed to be electrically connected to the first region 640 of the upper carrier substrate 602 (cf. FIG. 5B). The second power terminal can be designed e.g. as a $V_{SS}$ terminal.

In accordance with one example, a fourth power terminal 634 of the semiconductor package 600 can be electrically connected to the second carrier region 620 and can be configured as a phase terminal. The fourth power terminal 634 can be arranged on a second side of the lower carrier substrate 601, said second side being situated opposite the first side.

Figure 6B:
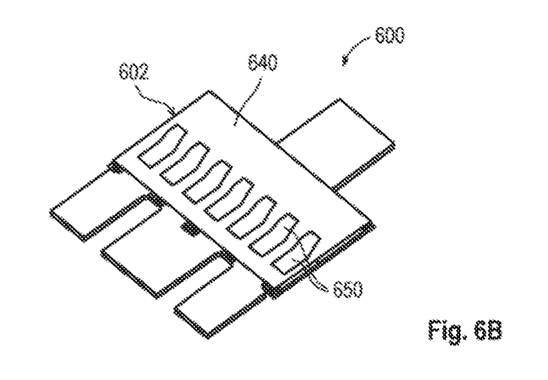
Figure 6C:
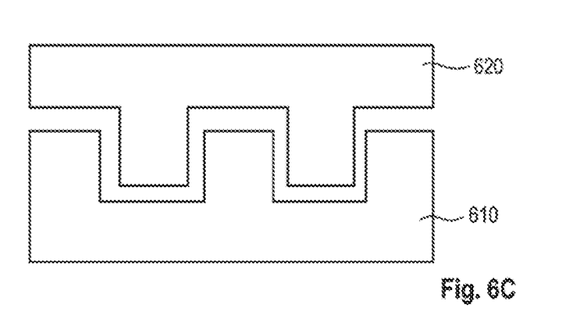

FIG. 6B shows the semiconductor package 600 after the upper carrier substrate 602 has been applied above the lower carrier substrate 601. The upper carrier substrate has the first region 640 and second regions 650. The first region 640 can be configured for applying $V_{SS}$ and the second regions 650 can be configured as a phase. The first region 640 is electrically connected to the third power terminal 633. The second regions 650 are respectively connected to an upper power electrode (e.g. the source electrode) of the first power semiconductor chips via a first electrically conductive spacer 661 and to the second carrier region 620 via a second electrically conductive spacer 662.

As can be discerned in FIG. 6B, the first region 640 of the upper carrier substrate 602 at least partly overlaps the first carrier region 610 of the lower carrier substrate 601.

In accordance with one example, the semiconductor package 600 furthermore has an encapsulation body, which at least partly encapsulates the upper and lower carrier substrates 601, 602. For reasons of clarity, such an encapsulation body is not shown in FIG. 6B. Furthermore, the semiconductor package 600 can have further structured regions on the lower and/or the upper carrier substrate 601, 602, e.g. control lines, and in addition further terminals such as measurement or control terminals. These are likewise not shown for reasons of clarity.

In accordance with one example, the boundary between the first carrier region 610 and the second carrier region 620 does not extend rectilinearly, but rather has a toothing. FIG. 6C shows a plan view of the boundary between the first carrier region 610 and the second carrier region 620 in accordance with one example having such a toothing. Such a course of the carrier regions 610, 620 can contribute to the first carrier region 610 being optimally overlapped by the first region 640 of the upper carrier substrate 602.

Figure 7:
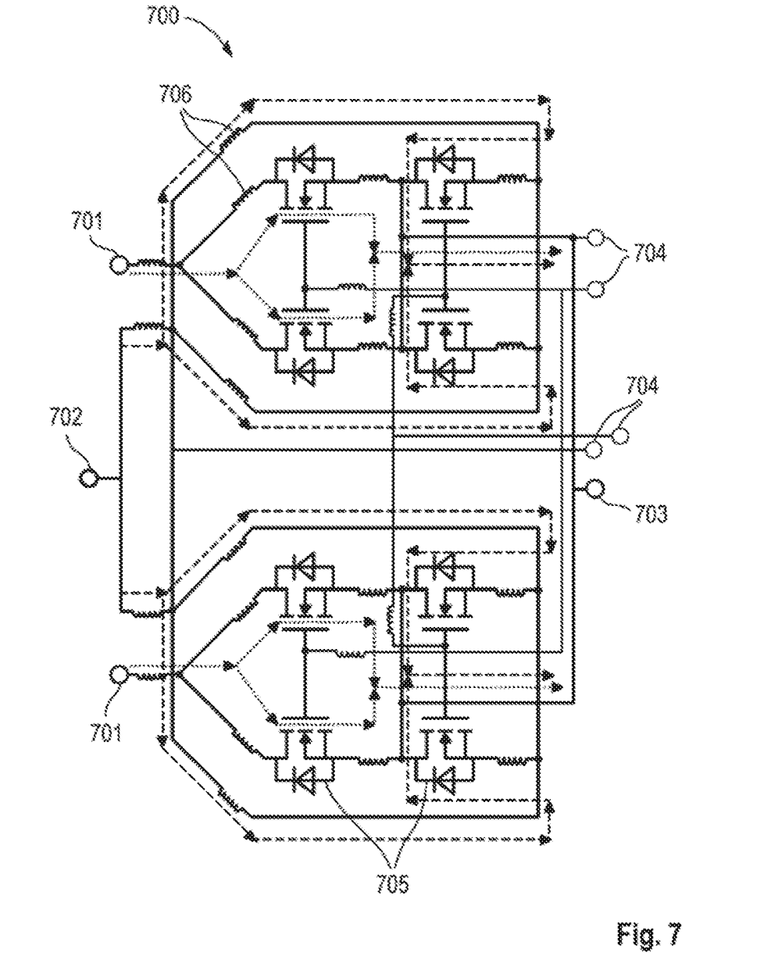
FIG. 7 shows by way of example an equivalent circuit diagram which may apply to the semiconductor packages in FIGS. 1-4 and 6.

FIG. 7 shows an equivalent circuit diagram 700 of a semiconductor package such as e.g. the semiconductor packages 100, 100_1, 200, 300, 400 and 600. The solid lines show the electrical lines. In accordance with one example the dotted lines show the current flow from $V_{DD}$ to the phase and the dashed lines show the current flow from $V_{SS}$ to the phase. In accordance with another example, the dotted lines show the current flow from $V_{SS}$ to the phase and the dashed lines show the current flow from $V_{DD}$ to the phase.

The points 701 can correspond to the first and second power terminals 312, 313, 412, 413, the point 702 can correspond to the third power terminal 390, 431 and the point 703 can correspond to the fourth power terminal 322, 422. The further points 704 can correspond to the control and/or measurement terminals. The transistors 105 can be realized by the first and second power semiconductor chips 311, 321, 411, 421.

FIG. 7 illustrates, in particular, the parasitic inductances 706 of the electrical conductors. The symmetrical structure readily discernible in FIG. 7 of the electrical circuit of the semiconductor packages 100, 100_1, 200, 300, 400 and 600 can contribute to effectively reducing said inductances.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A method for producing a double-sided coolable semiconductor package, the method comprising:
   providing a lower carrier substrate having an upper electrically conductive layer, a lower electrically conductive layer and an electrical insulation layer arranged between the upper and lower electrically conductive layers;
   applying a first electrically conductive spacer to the upper electrically conductive layer of the lower carrier substrate;
   applying a power semiconductor chip to the upper electrically conductive layer of the lower carrier substrate;

applying a second electrically conductive spacer to the power semiconductor chip;

applying an upper electrically conductive element on the first and second electrically conductive spacers opposite the lower carrier substrate; and arranging a first power terminal, a second power terminal and a third power terminal on the upper electrically conductive layer of the lower carrier substrate along a first side of the double-sided coolable semiconductor package, wherein the second power terminal is arranged between the first power terminal and the third power terminal, wherein the first power terminal and the third power terminal are electrically connected to a first carrier region of the upper electrically conductive layer of the lower carrier substrate, wherein the second power terminal is electrically connected to the upper electrically conductive element, and wherein the second power terminal is electrically isolated from the first power terminal.

2. The method of claim 1, wherein arranging the first power terminal, the second power terminal and the third power terminal comprises extracting the first power terminal, the second power terminal and the third power terminal from a lead frame.

3. The method of claim 1, further comprising:
electrically connecting the second power terminal to the upper electrically conductive element.

4. The method of claim 1, further comprising:
encapsulating the first electrically conductive spacer, the second electrically conductive spacer, the power semiconductor chip, the upper electrically conductive element and the lower carrier substrate in an encapsulation body.

5. The method of claim 4, wherein the encapsulating comprises compression molding.

6. A double-sided coolable semiconductor package, comprising:
an upper electrically conductive element having an outwardly exposed metal surface;
a lower carrier substrate having an upper electrically conductive layer, a lower electrically conductive layer having an outwardly exposed surface, and an electrical insulation layer arranged between the upper and lower electrically conductive layers;
a first electrically conductive spacer arranged between the upper electrically conductive element and the upper electrically conductive layer;
a power semiconductor chip arranged between the upper electrically conductive element and the upper electrically conductive layer;
a second electrically conductive spacer arranged between the upper electrically conductive element and the power semiconductor chip; and
a first power terminal, a second power terminal and a third power terminal arranged along a first side of the double-sided coolable semiconductor package,
wherein the second power terminal is arranged between the first power terminal and the third power terminal,
wherein the first power terminal and the third power terminal are electrically connected to a first carrier region of the upper electrically conductive layer of the lower carrier substrate,
wherein the second power terminal is electrically connected to the upper electrically conductive element, and
wherein the second power terminal is electrically isolated from the first power terminal.

7. The double-sided coolable semiconductor package of claim 6, wherein the upper electrically conductive element has an upper carrier substrate comprising an upper electrically conductive layer, a lower electrically conductive layer and an electrical insulation layer arranged between the upper and lower electrically conductive layers, and wherein the upper electrically conductive layer corresponds to the outwardly exposed metal surface.

8. The double-sided coolable semiconductor package of claim 6, wherein a first carrier region of the upper electrically conductive layer of the lower carrier substrate surrounds a second carrier region of the upper electrically conductive layer of the lower carrier substrate along at least two mutually opposite sides, and wherein the first region of the upper electrically conductive element at least partly covers the first carrier region.

9. The double-sided coolable semiconductor package of claim 6, wherein a central region of the upper electrically conductive layer of the lower carrier substrate is electrically connected to a control electrode of the power semiconductor chip, the upper electrically conductive element and a control terminal of the double-sided coolable semiconductor package.

10. The double-sided coolable semiconductor package of claim 6, further comprising:
an encapsulation body which at least partly encapsulates the lower carrier substrate and the upper electrically conductive element,
wherein the encapsulation body comprises a molding compound.

11. The double-sided coolable semiconductor package of claim 6, wherein the second power terminal is electrically connected to the upper electrically conductive element via the first electrically conductive spacer.

12. The double-sided coolable semiconductor package of claim 6, wherein a first region of the upper electrically conductive element is electrically connected to the second power terminal.

13. The double-sided coolable semiconductor package of claim 6, wherein the first power terminal, the second power terminal and the third power terminal are part of a lead frame.

14. The double-sided coolable semiconductor package of claim 6, wherein the power semiconductor chip comprises SiC.

15. The double-sided coolable semiconductor package of claim 6, wherein the power semiconductor chip is a low-side power semiconductor chip of a half-bridge circuit and is electrically connected to the second power terminal.

16. The double-sided coolable semiconductor package of claim 15, further comprising:
a further power semiconductor chip which is a high-side power semiconductor chip of the half-bridge circuit and is electrically connected to the first power terminal and the third power terminal.

17. The double-sided coolable semiconductor package of claim 6, further comprising:
a phase terminal arranged at a second side opposite the first side of the double-sided coolable semiconductor package.

18. The double-sided coolable semiconductor package of claim 17, wherein a first carrier region of the upper electrically conductive layer of the lower carrier substrate surrounds a second carrier region of the upper electrically conductive layer of the lower carrier substrate along at least two mutually opposite sides, and wherein the phase terminal is electrically connected to the second carrier region.

19. The double-sided coolable semiconductor package of claim 17, wherein a region of the upper electrically conductive element is electrically connected to the phase terminal.

\* \* \* \* \*